(12) United States Patent
Lee

(10) Patent No.: US 10,902,907 B1
(45) Date of Patent: Jan. 26, 2021

(54) OUTPUT DRIVERS, AND RELATED METHODS, MEMORY DEVICES, AND SYSTEMS

(71) Applicant: Micron Technology, Inc., Boise, ID (US)

(72) Inventor: Hyunui Lee, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/590,668

(22) Filed: Oct. 2, 2019

(51) Int. Cl.
| | | |
|---|---|---|
| *G11C 7/00* | (2006.01) | |
| *G11C 11/4096* | (2006.01) | |
| *G11C 11/4093* | (2006.01) | |
| *H01L 25/065* | (2006.01) | |
| *H01L 23/00* | (2006.01) | |
| *H01L 25/18* | (2006.01) | |

(52) U.S. Cl.
CPC ...... *G11C 11/4096* (2013.01); *G11C 11/4093* (2013.01); *H01L 24/16* (2013.01); *H01L 25/0657* (2013.01); *H01L 25/18* (2013.01); *H01L 2224/16225* (2013.01); *H01L 2225/06541* (2013.01); *H01L 2225/06565* (2013.01); *H01L 2924/1431* (2013.01); *H01L 2924/1436* (2013.01)

(58) Field of Classification Search
CPC ............ G11C 29/50008; G11C 29/028; G11C 7/1057; G11C 2207/2254; G11C 29/021; G11C 5/147; G11C 7/12; G11C 17/165; G11C 17/18; G11C 29/02; G11C 29/027; G11C 29/50
USPC .............................. 365/158, 189.07, 189.09
See application file for complete search history.

(56) References Cited

U.S. PATENT DOCUMENTS

| | | |
|---|---|---|
| 6,055,191 A | 4/2000 | Joseph et al. |
| 2018/0033470 A1* | 2/2018 | Lee .................. G11C 29/50008 |

\* cited by examiner

*Primary Examiner* — Thong Q Le
(74) *Attorney, Agent, or Firm* — TraskBritt

(57) ABSTRACT

An output driver is disclosed. An output driver may include a pre-driver and a main driver coupled to the pre-driver. The main driver may include at least one switch, and a first transistor coupled between a first supply voltage and the at least one switch. The main driver may also include a second transistor coupled between a second, different supply voltage and the at least one switch. The at least one switch is configured to couple an output node of the output driver to one of the first transistor and the second transistor in response to receipt of a control signal. The main driver may also include a third transistor coupled between a reference voltage and the output node. An electronic system including at least one output driver, and methods of operating an output driver are also described.

20 Claims, 9 Drawing Sheets

OUTPUT DRIVERS, AND RELATED METHODS, MEMORY DEVICES, AND SYSTEMS

TECHNICAL FIELD

Embodiments of the disclosure relate to output drivers. More specifically, various embodiments relate to an output driver of a memory device, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

A memory device stores digital data in an array of memory cells. To read information from such an array, a memory cell is sensed for the presence or absence of charge. The information may amplified and transferred from the memory device. Typically, an output driver, which may be coupled to or is part of an output buffer, may be used to transfer the information from the memory device.

DETAILED DESCRIPTION

Various embodiments described herein relate to output drivers configured for selectively operating at a number of supply voltages. For example, an output driver may include a main driver. The main driver may include a first transistor (e.g., a pull-up transistor), such as a p-channel metal-oxide-semiconductor (PMOS) transistor, configured to couple an output node (e.g., an output pad) of the output driver to a first supply voltage (e.g., in a first mode of operation). The main driver may also include a second transistor (e.g., a pull-up transistor), such as an n-channel metal-oxide-semiconductor (NMOS) transistor, configured to couple the output node to a second supply voltage (e.g., in a second mode of operation). In some embodiments, the first supply voltage (e.g., a high level supply voltage) may be greater than the second supply voltage (e.g., a low level supply voltage).

Further, in at least some embodiments, the output driver may include a switching unit, including one or more switches, for coupling the output node to the first transistor or the second transistor. Further, the output driver may include a control unit for conveying one or more signals to the switching unit for configuring the main driver such that the output node is coupled to either the first supply voltage (i.e., via a first pull-up transistor) or the second supply voltage (i.e., via a second pull-up transistor), depending on a desired mode of operation (e.g., a low power application or a high power application). The main driver may further include a third transistor (e.g., a pull-down transistor) configured for coupling the output node to a reference voltage, such as a ground voltage. Also, according to some embodiments, the output driver may include a pre-driver configured to convey one or more signals to the main driver.

Figure 1:
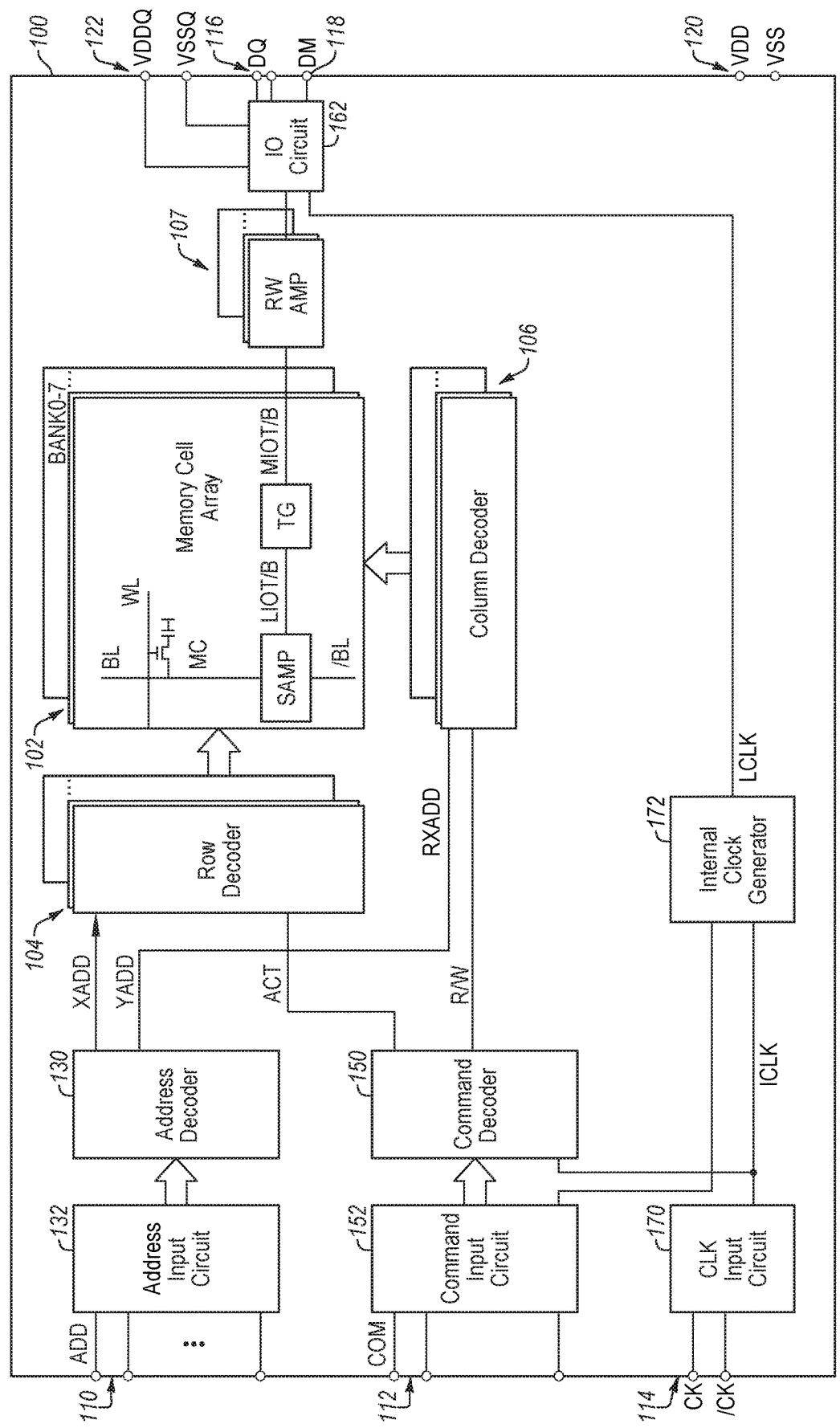
FIG. 1 is a block diagram of an example memory device, according to various embodiments of the present disclosure.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

According to various embodiments, input/output circuit 162 may include one or more output drivers, as described more fully herein. More specifically, input/output circuit 162 may include a number of output drivers, wherein at least some of the output drivers of input/output circuit 162 may be configured for selectively operating in a number of configurations (e.g., based on a desired mode of operation (e.g., a low power application or a high power application)). More specifically, as described more fully herein, at least some of the output drivers of input/output circuit 162 may be configured to operate in an NMOS/NMOS configuration in a low power mode (e.g., utilizing a low level supply voltage) or a PMOS/NMOS configuration in a high power mode (e.g., utilizing a high level supply voltage).

Clock signals CK and /CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 2:
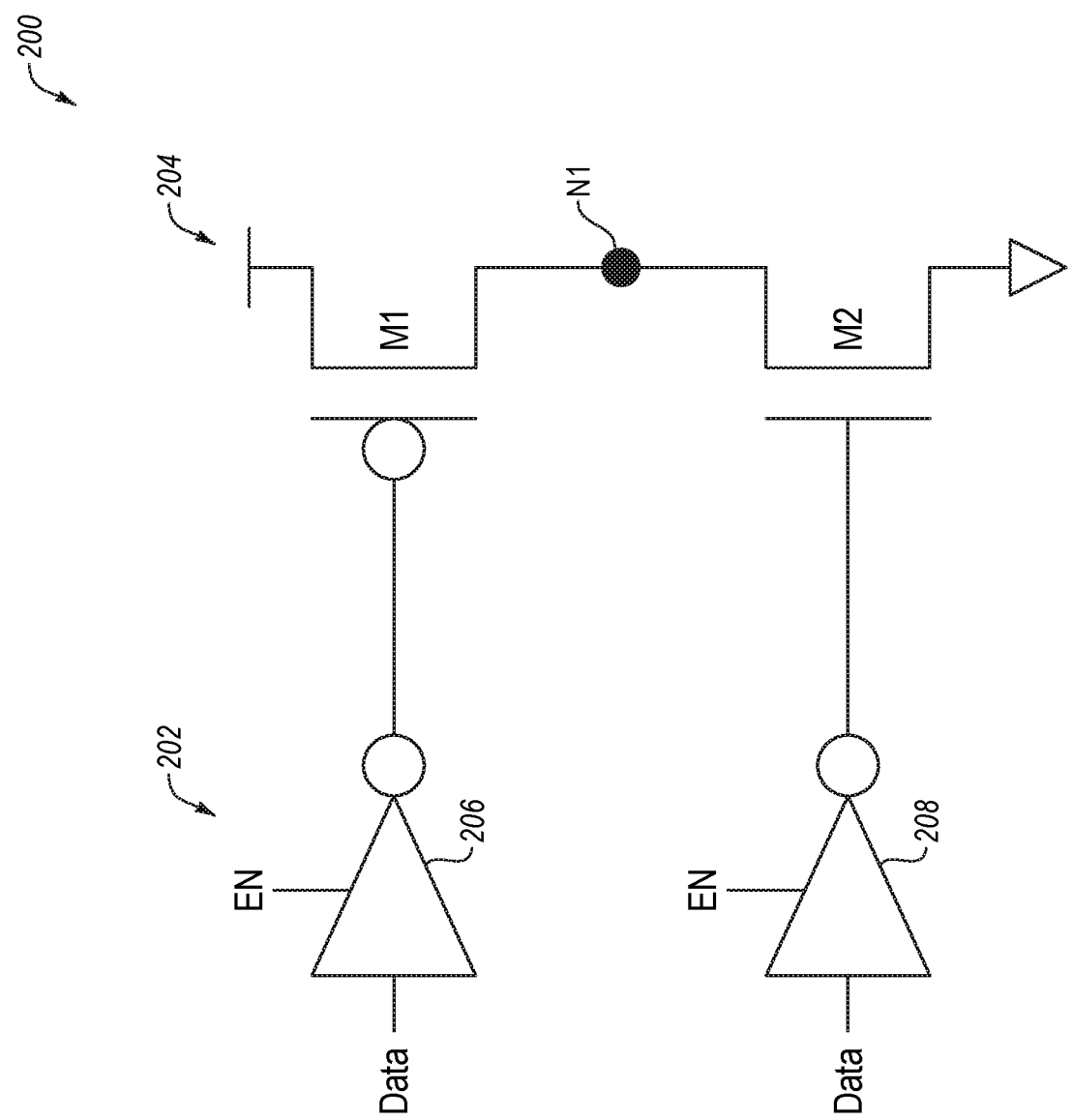
FIG. 2 is depicts an output driver including a pre-driver and a main driver.

FIG. 2 depicts an output driver 200 including a pre-driver 202 and a main driver 204. Pre-driver 202 includes an inverter 206 and an inverter 208. Each of inverter 206 and inverter 208 are configured to receive a data signal DATA and an enable signal EN. Main driver 204 includes a pull-up transistor M1, which is a p-channel metal-oxide-semiconductor (PMOS) transistor, and a pull-down transistor M2, which is an n-channel metal-oxide-semiconductor (NMOS).

A first terminal (e.g., a drain or a source) of transistor M1 is coupled to a supply voltage, a gate of transistor M1 is coupled to an output of inverter 206, and another terminal (e.g., a source or a drain) of transistor M1 is coupled to a node N1. Further, a first terminal (e.g., a source or a drain) of transistor M2 is coupled to node N1, a gate of transistor M2 is coupled to an output of inverter 208, and a second terminal (e.g., a drain or a source) of transistor M2 is coupled to a reference (e.g., a ground voltage).

As will be appreciated, output driver 200 may be used in devices (e.g., desktops, servers, and the like) that operate at relatively high level supply voltages (e.g., 1.2-2.5 volts). Thus, the use of PMOS and NMOS transistors, which may improve signal integrity (e.g., in contrast to the use of only NMOS transistors), may be feasible.

Figure 3:
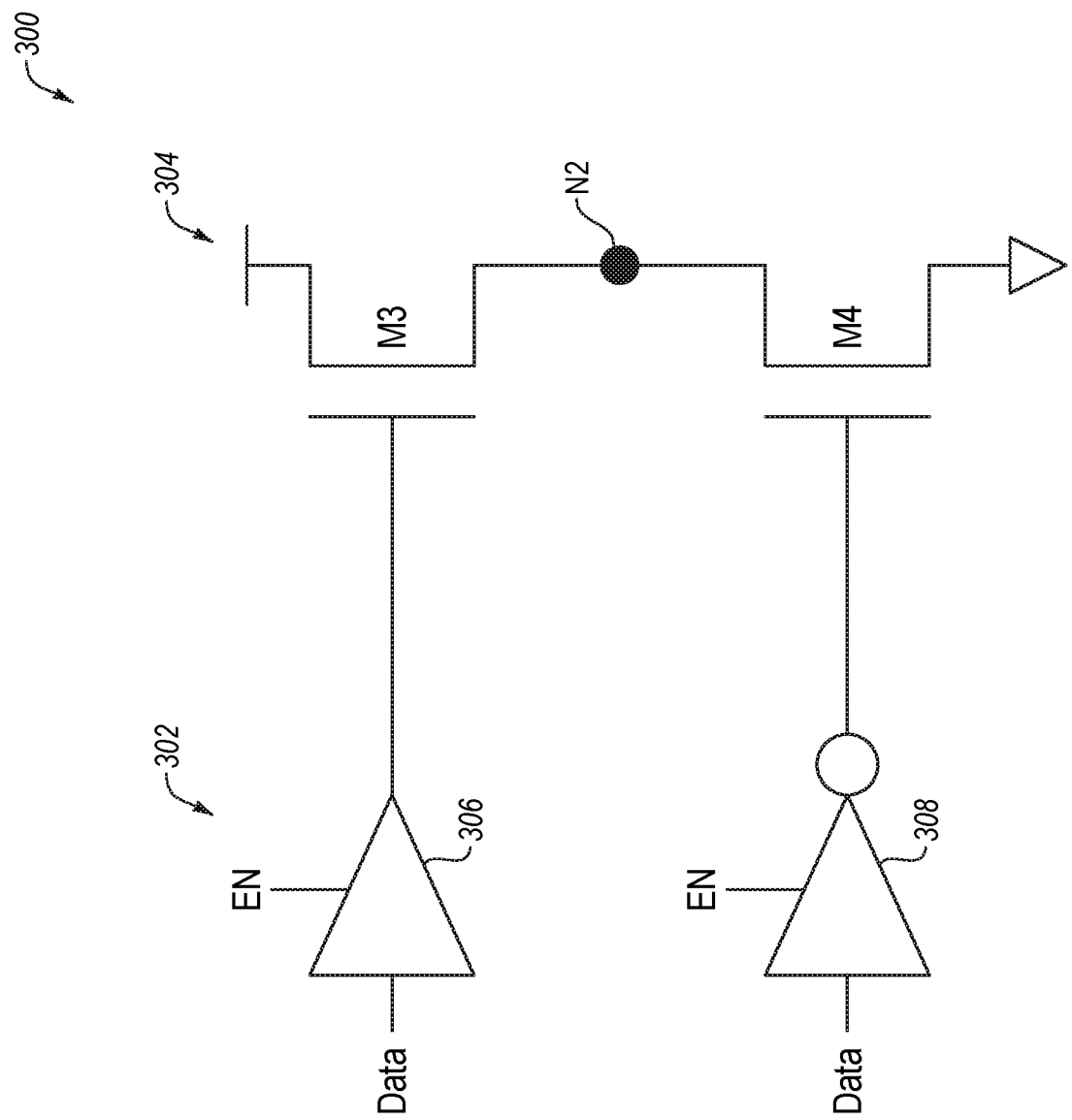
FIG. 3 depicts another output driver including a pre-driver and a main driver.

FIG. 3 depicts another output driver 300 including a pre-driver 302 and a main driver 304. In one embodiments, pre-driver 302 includes a buffer 306 and an inverter 308. In other embodiments, as will be appreciated, buffer 306 may be replaced with an inverter, and inverter 308 may be replaced by a buffer. Each of buffer 306 and inverter 308 are configured to receive data signal DATA and enable signal EN. Main driver 304 includes a pull-up transistor M3, which is an NMOS transistor, and a pull-down transistor M4, which is also an NMOS transistor.

A terminal (e.g., a source or drain) of transistor M3 is coupled to a supply voltage, a gate of transistor M3 is coupled to an output of buffer 306, and another terminal (e.g., a drain or source) of transistor M3 is coupled to a node N2. Further, a terminal (e.g., a source or a drain) of transistor M4 is coupled to node N2, a gate of transistor M4 is coupled to an output of inverter 308, and another terminal (e.g., a drain or a source) of transistor M4 is coupled to a reference (e.g., a ground voltage).

Output driver 300, which may be used in low-power memory (e.g., low-power DDR) mobile applications (e.g., mobile devices, such as a tablet or mobile phone), is configured to operate at relatively low level supply voltages (e.g., less than 1.2 volts). Therefore, as will be appreciated by a person of ordinary skill in the art, the use of a PMOS transistor may not be feasible, and thus, in at least these applications, signal integrity may be reduced (e.g., due to the lack of a PMOS transistor).

Figure 4A:
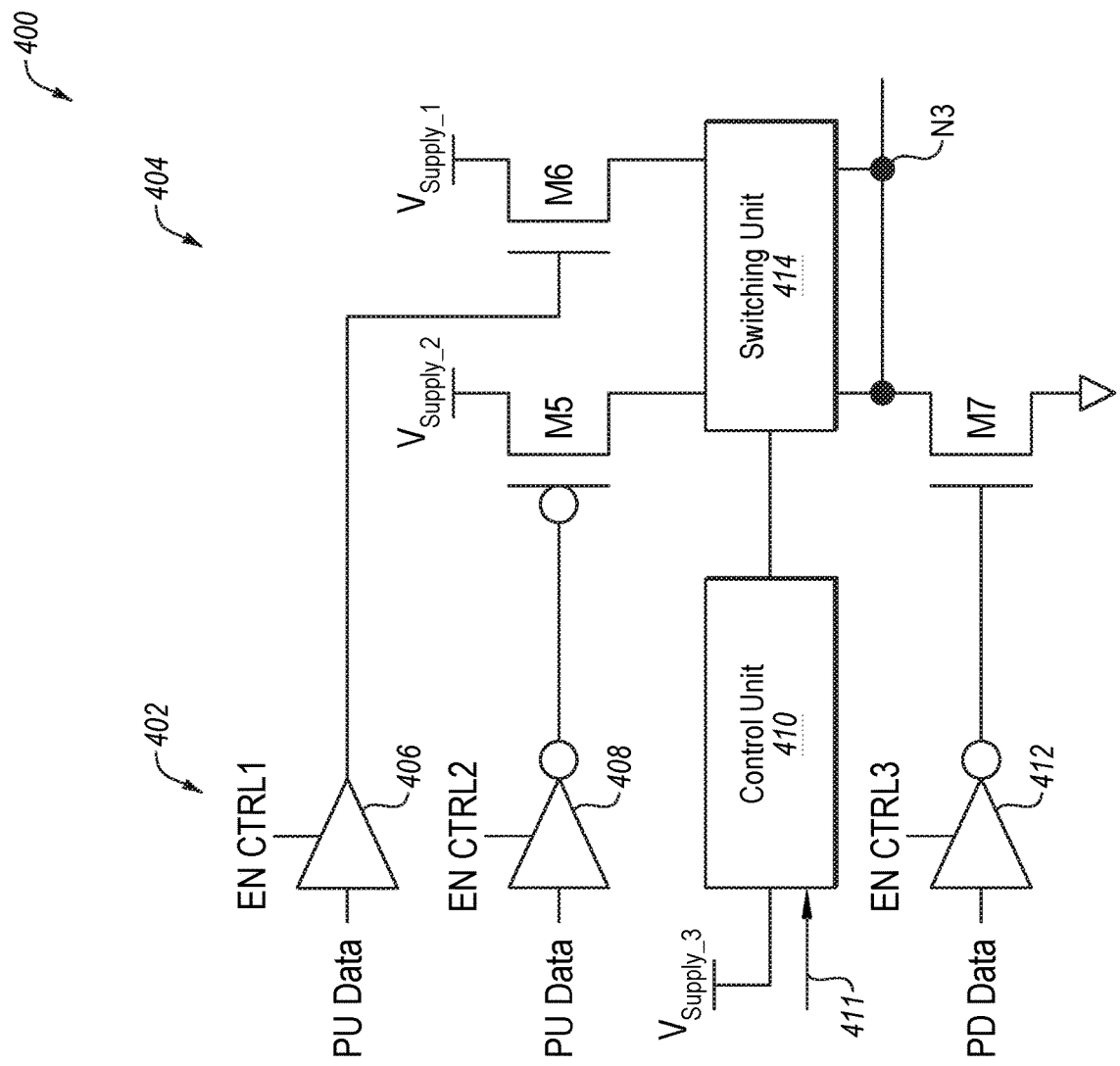
FIG. 4A illustrates an example output driver including a pre-driver and a main driver, according to various embodiments of the present disclosure.

FIG. 4A illustrates an example output driver 400, according to various embodiments of the present disclosure. Output driver 400 includes pre-driver 402 and a main driver 404. Pre-driver 402 includes a buffer 406, an inverter 408, a control unit 410, and an inverter 412. In other embodiments, as will be appreciated, buffer 406 may be replaced with an inverter, and inverter 408 and/or inverter 412 may be replaced by a buffer. Main driver 404 includes a transistor M5, a transistor M6, and a transistor M7. In this example, transistors M5 and M6 are configured as pull-up transistors, and transistor M7 is configured as a pull-down transistors. Further, in this illustrated embodiment, transistor M5 is a PMOS transistor, transistor M6 is an NMOS transistor, and transistor M7 is an NMOS transistor. Main driver 404 further includes a switching unit 414, which is coupled to a node N3. For example, node N3 may include or may be coupled to an input/output terminal (e.g., a DQ node (also referred to herein as a "DQ pad") of a memory device, such as memory device 100 of FIG. 1).

A terminal (e.g., a drain or a source) of transistor M5 is coupled to a supply voltage $V_{supply\_2}$, a gate of transistor M5 is coupled to an output of inverter 408, and another terminal (e.g., a source or a drain) of transistor M5 is coupled to switching unit 414. Further, a source of transistor M6 is coupled to supply voltage $V_{supply\_1}$, a gate of transistor M6 is coupled to an output of buffer 406, and a drain of transistor M6 is coupled to switching unit 414. Also, a terminal (e.g., a source or a drain) of transistor M7 is coupled to node N3, a gate of transistor M7 is coupled to an output of inverter 412, and a drain of transistor M7 is coupled to a reference voltage (e.g., a ground voltage). According to various embodiments described more fully below, supply voltage $V_{supply\_2}$ may be a voltage for high power applications (e.g., desktops, servers, without limitation), and supply voltage $V_{Supply\_1}$ may be a voltage for low power applications (e.g., mobile devices, such as mobile phones, tablets, without limitation). Thus, in at least these embodiments, supply voltage $V_{Supply\_2}$ is greater than supply voltage $V_{Supply\_1}$.

During a contemplated operation, buffer 406 is configured to receive a pull-up data signal PU Data (e.g., either a HIGH or LOW signal) and an enable signal EN CTRL1, and convey a signal (e.g., either a HIGH or LOW signal) to the gate of transistor M6. Further, inverter 408 is configured to receive pull-up data signal PU Data (e.g., either a HIGH or LOW signal) and an enable signal EN CTRL2, and convey a signal (e.g., either a HIGH or LOW signal) to the gate of transistor M5.

As will be appreciated, if buffer 406 receives an asserted enable signal EN CTRL1 and a HIGH pull-up data signal PU Data, buffer 406 may convey a HIGH signal to the gate of transistor M6. If buffer 406 receives an asserted enable signal EN CTRL1 and a LOW pull-up data signal PU Data, buffer 406 may convey a LOW signal to the gate of transistor M6. Further, if inverter 408 receives an asserted enable signal EN CTRL2 and a HIGH pull-up data signal PU Data, inverter 408 may convey a LOW signal to the gate of transistor M5. If inverter 408 receives an asserted enable signal EN CTRL2 and a LOW pull-up data signal PU Data, inverter 408 may convey a HIGH signal to the gate of transistor M5. Moreover, if inverter 412 receives an asserted enable signal EN CTRL3 and a HIGH pull-down data signal PD Data, inverter 412 may convey a LOW signal to the gate of transistor M7. If inverter 412 receives an asserted enable signal EN CTRL3 and a LOW pull-down data signal PD Data, inverter 412 may convey a HIGH signal to the gate of transistor M7.

Further, control unit 410 may be configured to convey a control signal to switching unit 414 for configuring switching unit 414 such that node N3, which may include a DQ node, is coupled to transistor M5 or transistor M6, or node N3 is decoupled from both transistor M5 and transistor M6. More specifically, based on one or more settings (e.g., one or more mode register settings and/or user settings) and/or one or received signals 411 (e.g., enable signal EN CTRL1, enable signal EN CTRL2, enable signal EN CTRL3, and/or mode register signals), control unit 410 may convey one or more controls signal to switching unit 414 for configuring one or more switches of switching unit 414. As illustrated, control unit 410 may receive a supply voltage $V_{Supply\_3}$. For example, in some embodiments, supply voltage $V_{Supply\_3}$ may be substantially equal to a supply voltage $V_{Supply\_2}$.

Figure 4B:
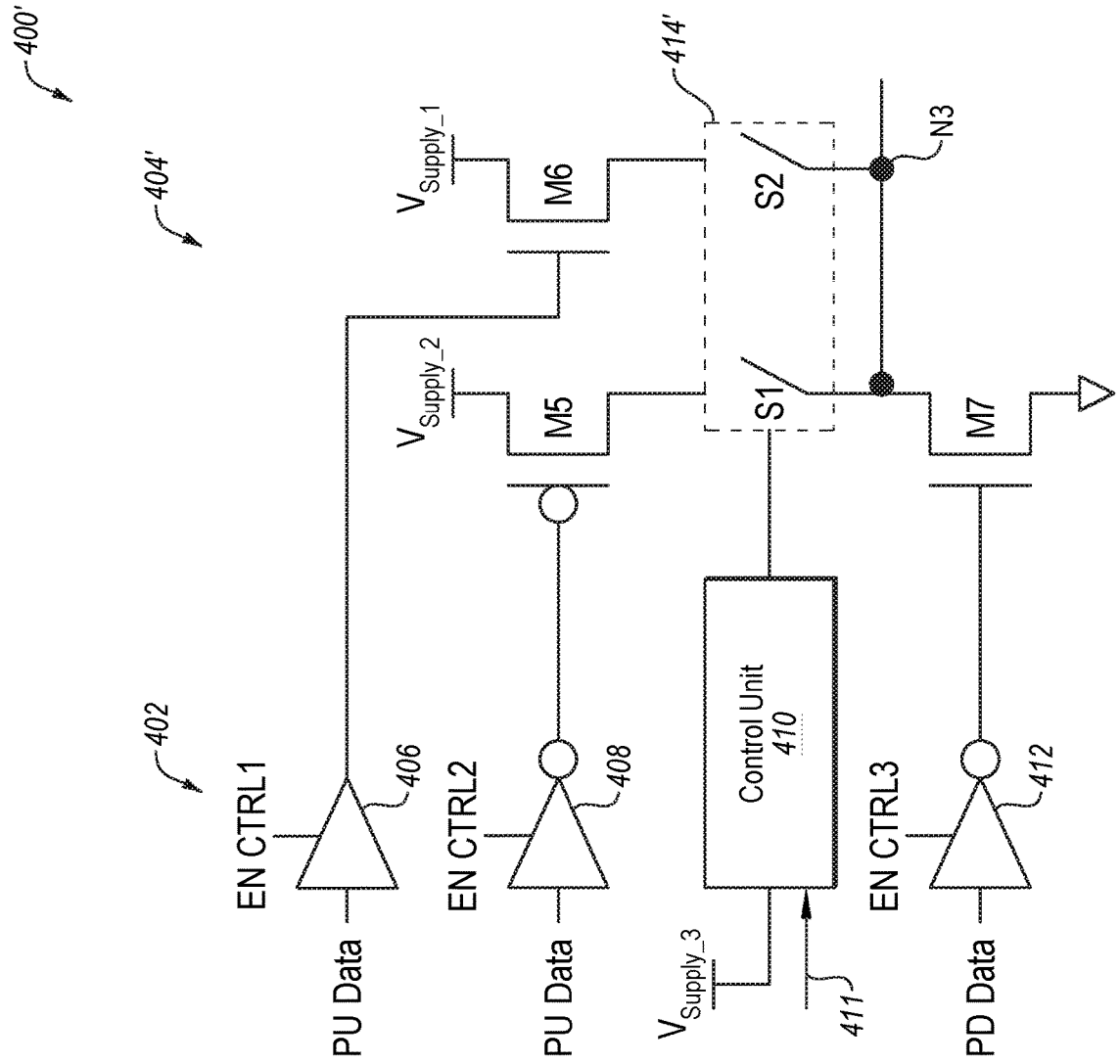
FIG. 4B is another illustration of an example output driver including a pre-driver and a main driver, according to various embodiments of the present disclosure.

As shown in FIG. 4B, an example switching unit 414' of a main driver 404' of an output driver 400' includes switches S1 and S2 for selectively coupling node N3 to transistor M5 or transistor M6, or for decoupling node N3 from both transistor M5 and transistor M6. Switching unit 414' is provided as an example switching unit, and other switching units (e.g., including more than two switches or less than two switches) are within the scope of the present disclosure.

As will be appreciated, decoupling either transistor M5 or transistor M6 from node N3 may desirably reduce a capacitance of node N3, and thus data transfer via node N3 (e.g., to a host device) may be improved (e.g., a speed of data transfer may be increased). Further, according to some embodiments, the sizes (e.g., the widths) of switches of switching unit 414 may be less than the sizes (e.g., the widths) of transistors M5 and M6. More specifically, for example, switch S1 may be smaller in size than transistor M5, and switch S2 may be smaller in size than transistor M6. As a more specific example, switch S may be smaller in size than each of transistor M5 and transistor M6, and switch S2 may be smaller in size than each of transistor M5 and transistor M6. Further, for example, each of switches S1 and S2 (e.g., a type and/or a size) may be selected based on a desired application and/or product specification (e.g., as desired by customers and/or vendors). Similarly, for example, each of transistors M5 and M6 (e.g., a type and/or a size) may be selected based on a desired application and/or product specification.

For example, in one contemplated operation, a memory device (e.g., memory device 100 of FIG. 1) including output driver 400 may be operate in a first mode (e.g., a low-power mode) (e.g., as desired by a customer and/or a vendor and/or in response to a use case). In this mode, control unit 410 may convey one or more control signals to switching unit 414 to couple node N3 to transistor M6. Thus, in this mode, main driver 404 is configured in an NMOS/NMOS configuration (i.e., NMOS transistor M6 and NMOS transistor M7 are coupled to node N3). Further, in this mode, buffer 406 may be enabled (i.e., via enable signal EN CTRL1), and buffer 406 may convey pull-up data signal PU Data to the gate of transistor M6. In response to pull-up data signal PU Data being HIGH, transistor M6 may conduct and node N3 may be coupled to supply voltage $V_{Supply\_1}$, which in this example, is a relatively low supply voltage (e.g., 1.2 volts, 1.1 volts, 0.5 volts, or another voltage).

As another example, a memory device (e.g., memory device 100 of FIG. 1) including output driver 400 may be operate in a second mode (e.g., a high-power mode) (e.g., as desired by a customer and/or a vendor, and/or in response to a use case). In this mode, control unit 410 may convey one or more controls signal to switching unit 414 to couple node N3 to transistor M5. Thus, in this mode, main driver 404 is configured in a PMOS/NMOS configuration (i.e., PMOS transistor M5 and NMOS transistor M7 are coupled to node N3). Further, in this mode, inverter 408 may be enabled (i.e., via enable signal EN CTRL2), and inverter 408 may convey pull-up data signal PU Data to transistor M5. In response to pull-up data signal PU Data being HIGH, transistor M5 may conduct and node N3 may be coupled to supply voltage $V_{Supply\_2}$, which in this example, is a relatively high supply voltage (e.g., 2.5 volts, 1.8 volts, 1.2 volts, or another voltage).

As noted herein, control unit 410 may convey one or more control signals to switching unit 414 for configuring one or more switches such that node N3 may be coupled to either supply voltage $V_{Supply\_1}$ (i.e., via transistor M6) or supply voltage $V_{Supply\_2}$ (i.e., via transistor M5). According to various embodiments, the one or more control signals sent from control unit 410 to switching unit 414 may be responsive to user action (e.g., selecting a low power mode or a high power mode). More specifically, the one or more control signals may be dynamically generated responsive to user action. Alternatively or additionally, in some embodiments, the one or more control signals sent from control unit 410 to switching unit 414 may be responsive to one or more settings (e.g., one or more mode registers setting (e.g., set via one or more mode register bits)).

It is noted that output driver 400 is provided as an example output driver, and other possible output driver configurations are within the scope of the disclosure. For example, any output driver configured such that an output node (e.g., a DQ node) may be selectively coupled to either a first supply voltage via a first pull-up transistor (e.g., a PMOS transistor) or a second supply voltage via a second pull-up transistor (e.g., an NMOS transistor) is within the scope of the disclosure.

Figure 5:
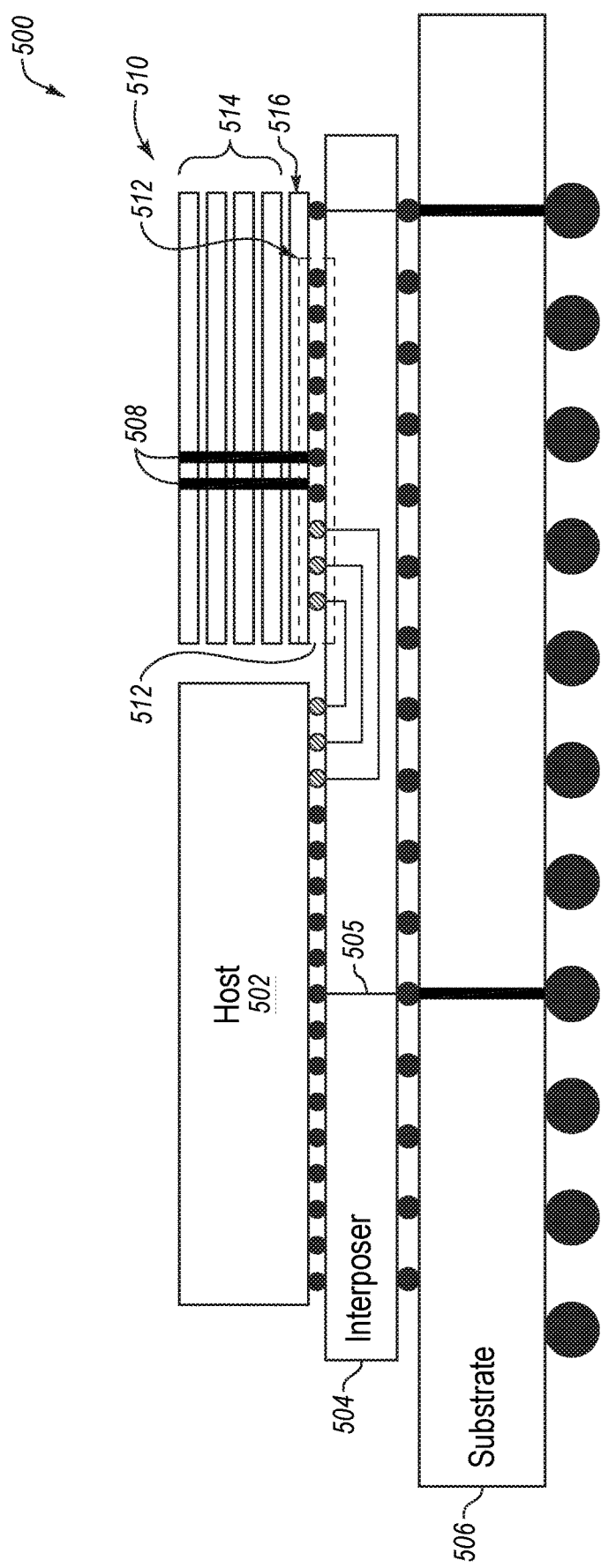
FIG. 5 illustrates an example system including a memory device, in accordance with various embodiments of the present disclosure.

FIG. 5 depicts a system 500, in accordance with various embodiments of the present disclosure. System 500, which may also be referred to herein as a "system-in-package" or a "semiconductor package," includes a host 502, an interposer 504, and a substrate 506. System 500 further includes a through-silicon via (TSV) 505, a TSV 508 and a device 510, which may include, for example, a number of DRAM dies (e.g., a high bandwidth memory (HBM) stack of DRAM dies).

Device 510 may include a core die 514 and logic die 516. Core die 514 may include the number of DRAM dies, and logic die 516 may include circuitry (e.g., interface circuitry such as input/output circuit 162 of FIG. 1 and/or other circuitry). In some embodiments, core die 514 and logic die 516 may be connected via a TSV.

System 500, and more specifically logic die 516, may also include an input/output device 512 including, for example, a number of micro bumps for coupling device 510 to host 502 and/or other devices. Although FIG. 5 illustrates device 510 coupled to host 502 via only three (3) micro bumps, device 510 may be coupled to host 502 via any number of micro bumps (e.g., each illustrated micro bump of input/output device 512). By way of non-limiting example, logic die 516 may include one or more output drivers (e.g., output driver 400/400' illustrated in FIGS. 4A and 4B) for driving output signals to host 502. As described herein, via decoupling a transistor (e.g., transistor M5 or transistor M6 of FIGS. 4A and 4B) of an output driver (e.g., of logic die 516) from a DQ node (e.g., output node N3 of FIGS. 4A and 4B), a capacitance value of the DQ node may be reduced. Thus, in at least embodiments, communication between logic die 516 and host 502 may be enhanced (e.g., a speed of the communication between logic die 516 and host 502 may be increased).

Figure 6:
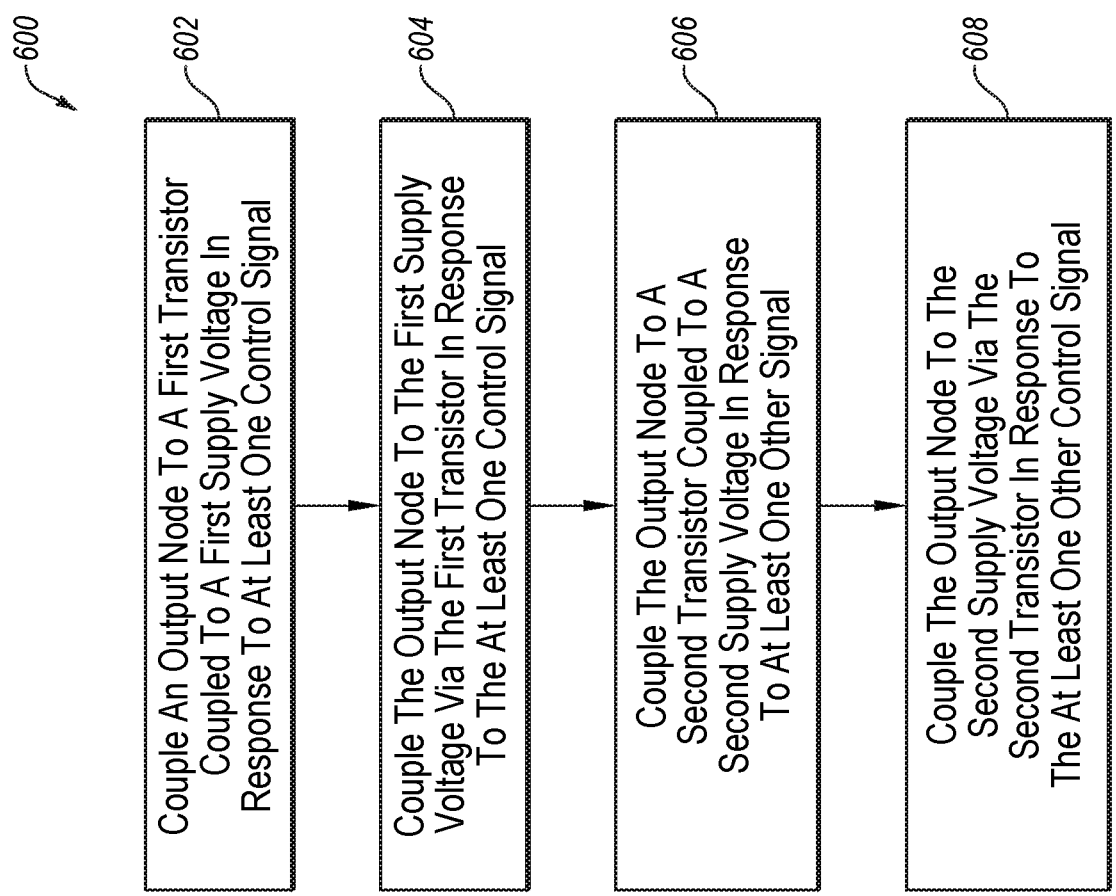
FIG. 6 is a flowchart of an example method of operating an output driver, in accordance with various embodiments of the present disclosure.

FIG. 6 is a flowchart of an example method 600 of operating an output device, in accordance with various embodiments of the disclosure. Method 600 may be arranged in accordance with at least one embodiment described in the present disclosure. Method 600 may be performed, in some embodiments, by a device or system, such as memory device 100 of FIG. 1, output driver 400 of FIG. 4A, output driver 400' of FIG. 4B, system 500 of FIG. 5, memory device 700 of FIG. 7, and/or electronic system 800 of FIG. 8, or another device or system. Although illustrated as discrete blocks, various blocks may be divided into additional blocks, combined into fewer blocks, or eliminated, depending on the desired implementation.

Method 600 may begin at block 602, wherein an output node may be coupled to a first transistor, and method 600 may proceed to block 604. For example, in response to at least one control signal (e.g., generated via control unit 410 of FIGS. 4A and 4B), output node (e.g., node N3 of FIGS. 4A and 4B) may be coupled to the first transistor (e.g., transistor M6) via a switching unit (e.g., switching unit 414 of FIG. 4A), which may include one or more switches (e.g., switch S and S2 of FIG. 4B). Further, for example, the first transistor, which may include a NMOS transistor, may be coupled to a first supply voltage (e.g., supply voltage $V_{Supply\_1}$).

At block 604, the output node may be coupled to a first supply voltage via the first transistor, and method 600 may proceed to block 606. For example, in response to a signal from a pre-driver (e.g., pre-driver 402 of FIGS. 4A and 4B), the first transistor (e.g., transistor M6 of FIGS. 4A and 4B) may conduct to couple the first supply voltage (e.g., supply voltage $V_{Supply\_1}$) to the output node (e.g., node N3), which may include or may be coupled to an input/output (DQ) pad. For example, supply voltage $V_{Supply\_1}$ may be approximately 1.2 volts, 1.1 volts, 0.5 volts, or another voltage.

At block 606, the output node may be coupled to a second transistor, and method 600 may proceed to block 608. For example, in response to at least one control signal (e.g., generated via control unit 410 of FIGS. 4A and 4B), output node (e.g., node N3 of FIGS. 4A and 4B) may be coupled to the second transistor (e.g., transistor M5) via a switching unit (e.g., switching unit 414 of FIG. 4A), which may include one or more switches (e.g., switch S1 and switch S2 of FIG. 4B). Further, for example, the second transistor, which may include a PMOS transistor, may be coupled to a second supply voltage (e.g., supply voltage $V_{Supply\_2}$).

At block 608, the output node may be coupled to a second supply voltage via the second transistor. For example, in response to a signal from a pre-driver (e.g., pre-driver 402 of FIGS. 4A and 4B), the second transistor (e.g., transistor M5 of FIGS. 4A and 4B) may conduct to couple the second supply voltage (e.g., supply voltage $V_{Supply\_2}$) to the output node (e.g., node N3), which may include or may be coupled to a DQ pad. For example, supply voltage $V_{Supply\_2}$, which may be approximately 1.2 volts, 1.8 volts, 2.5 volts, or another voltage, may be greater than supply voltage $V_{Supply\_1}$.

Modifications, additions, or omissions may be made to method 600 without departing from the scope of the present disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein one or more control signals may be conveyed from a control unit (e.g., control unit 410 of FIGS. 4A and 4B) to a switching unit (e.g., switching unit 414 of FIG. 4A) for coupling the output node to the first transistor or the second transistor. Moreover, a method may include one or more acts wherein the control unit may receive one or more signals (e.g., enable signal, control signals, mode register signals). Further, for example, a method may include one or more acts wherein one or more signals (e.g., enable signals and/or data signals) may be received at a pre-driver (e.g., pre-driver 402 of FIGS. 4A and 4B). Further, a method may include one or more acts wherein one or more signals may be conveyed from a pre-driver (e.g., pre-driver 402 of FIGS. 4A and 4B) to the first transistor (e.g., transistor M6 of FIGS. 4A and 4B), the second transistor (e.g., transistor M5 of FIGS. 4A and 4B), a third transistor (e.g., transistor M7 of FIGS. 4A and 4B) and/or the switching unit (e.g., switching unit 414 of FIG. 4A). Moreover, a method may include an act wherein the output node is coupled to a reference voltage (e.g., a ground voltage) (e.g., via transistor M7 of FIGS. 4A and 4B).

A memory device is also disclosed. According to various embodiments, the memory device may include one or more memory cell arrays, such as memory cell array 102 (see FIG. 1). The one or more memory cell arrays may include a number of memory cells.

Figure 7:
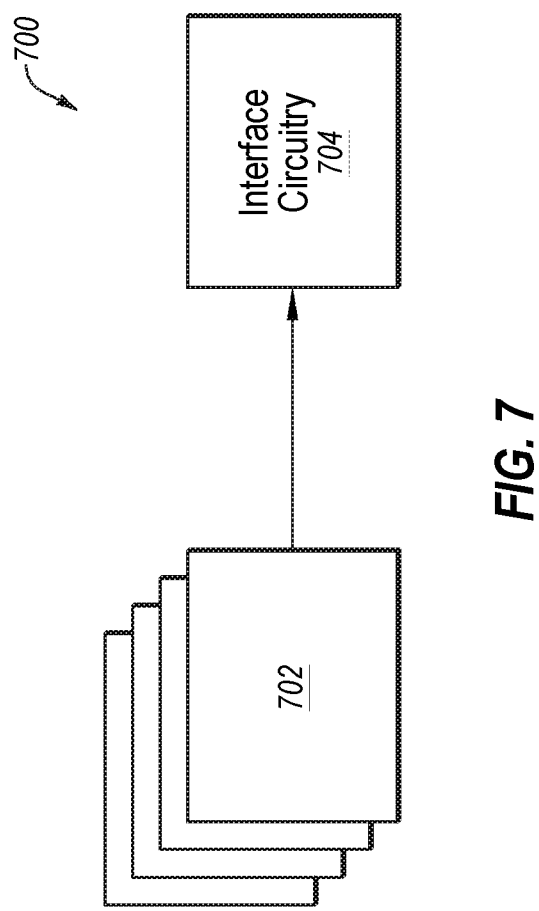
FIG. 7 is a simplified block diagram of an example memory device, in accordance with various embodiments of the present disclosure.

FIG. 7 is a simplified block diagram of a memory device 700 implemented according to one or more embodiments described herein. Memory device 700, which may include, for example, a semiconductor device, includes a memory array 702 and interface circuitry 704. Memory array 702, which may include a number of memory banks, may include a number of memory cells.

Interface circuitry 704 may be operatively coupled with memory array 702 so as to enable data to be read from or written to any or all memory cells within memory array 702. Interface circuitry 704, which may include one or more output drivers, may be configured for carrying out one or more embodiments disclosed herein. For example, in some embodiments, interface circuitry 704, which may include, for example, output driver 400/400' of FIGS. 4A and 4B, may be configured to couple an output node (e.g., a DQ node) to a first supply voltage (e.g., via a first transistor) in response to at least one control signal, and couple the output node to a second supply voltage (e.g., via a second transistor) in response to at least one other control signal, in accordance with various embodiments disclosed herein.

A system is also disclosed. According to various embodiments, the system may include a memory device including a number of memory banks, each memory bank having an array of memory cells. Each memory cell may include an access transistor and a storage element operably coupled with the access transistor.

Figure 8:
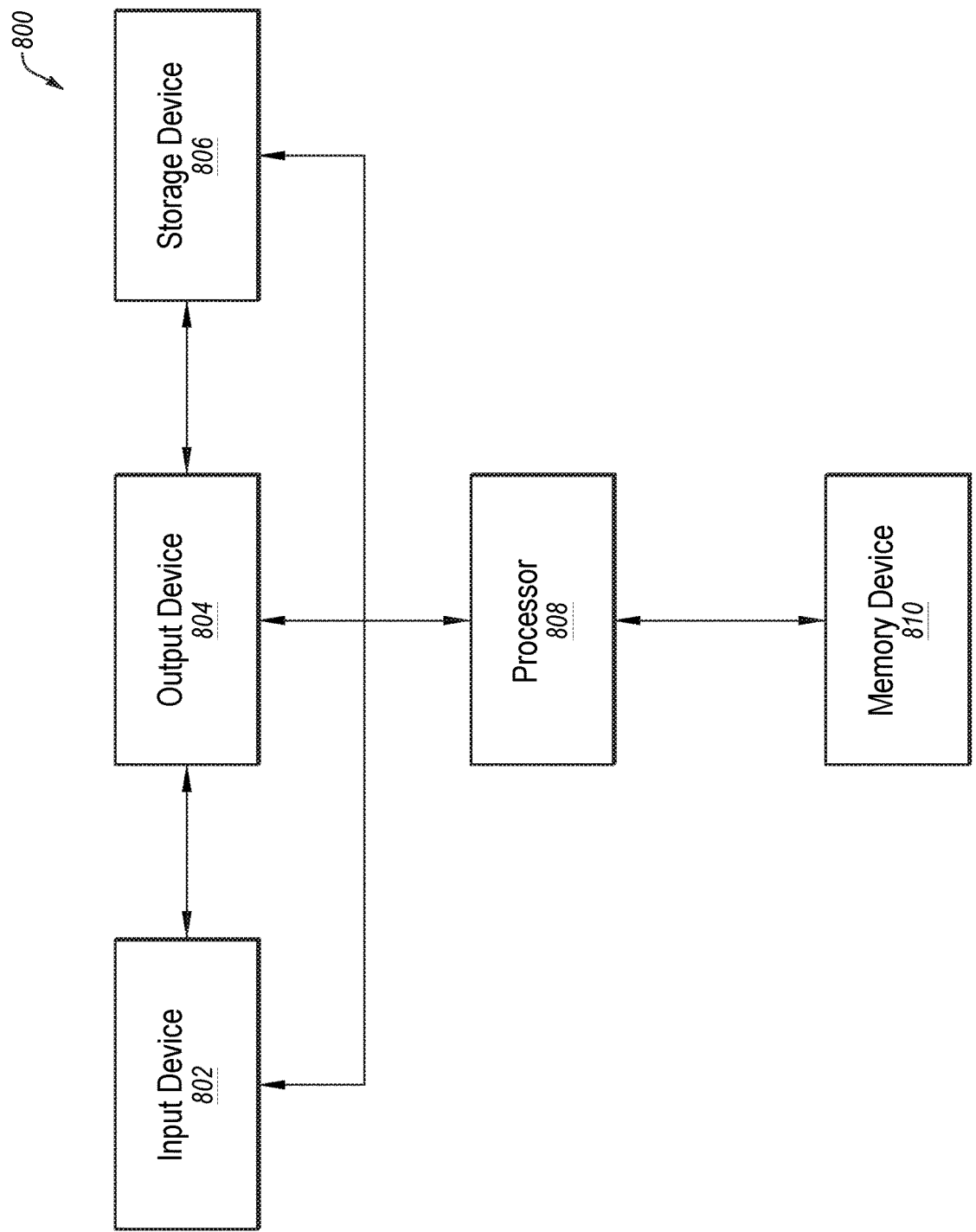
FIG. 8 is a simplified block diagram of an example electronic system, in accordance with various embodiments of the present disclosure.

FIG. 8 is a simplified block diagram of an electronic system 800 implemented according to one or more embodiments described herein. Electronic system 800 includes at least one input device 802, which may include, for example, a keyboard, a mouse, or a touch screen. Electronic system 800 further includes at least one output device 804, such as a monitor, a touch screen, or a speaker. Input device 802 and output device 804 are not necessarily separable from one another. Electronic system 800 further includes a storage device 806. Input device 802, output device 804, and storage device 806 may be coupled to a processor 808. Electronic system 800 further includes a memory device 810 coupled to processor 808. Memory device 810, which may include memory device 700 of FIG. 7, may include an array of memory cells. Electronic system 800 may include, for example, a computing, processing, industrial, or consumer product. For example, without limitation, electronic system 800 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

As described herein, an output driver (e.g., of a memory device) may be configured to operate at a low level supply voltage (e.g., in an NMOS/NMOS configuration) without utilizing a PMOS transistor, which may not operate properly at low voltage levels. The output driver may also be configured to operate at a high-level supply voltage while utilizing a PMOS transistor and an NMOS transistor (e.g., in a PMOS/NMOS configuration), which may improve signal integrity.

Various embodiments of the present disclosure may include an output driver. The output driver may include a pre-driver and a main driver coupled to the pre-driver. The main driver may include at least one switch and a first transistor coupled between a first supply voltage and the at least one switch. The main driver may also include a second transistor coupled between a second, different supply voltage and the at least one switch. The at least one switch may be configured to couple an output node of the output driver to one of the first transistor and the second transistor in response to receipt of a control signal. The main driver may also include a third transistor coupled between a reference voltage and the output node.

One or more other embodiments of the present disclosure include a method of operating an output driver. The method may include coupling an output node of an output driver to a first transistor coupled to a first supply voltage in response to at least one control signal. The method may also include coupling the output node to the first supply voltage via the first transistor in response to the at least one control signal. The method may further include coupling the output node to a second transistor coupled to a second supply voltage in response to at least one other control signal. Moreover, the method may include coupling the output node to the second supply voltage via the second transistor in response to the at least one other control signal.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and comprising interface circuitry including at least one output driver. The at least one output driver may include an output node. The at least one output driver may further include a first transistor configured to couple to a first supply voltage. Also, the at least one output driver may include a second transistor configured to couple to a second supply voltage. The at least one output driver may further include a switching unit configured to couple the output node to one of the first transistor and the second transistor in response to receipt of a control signal.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. An output driver, comprising:
    a pre-driver; and
    a main driver coupled to the pre-driver and including:
        at least one switch;
        a first transistor coupled between a first supply voltage and the at least one switch;
        a second transistor coupled between a second, different supply voltage and the at least one switch, the at least one switch configured to couple an output node to one of the first transistor and the second transistor in response to receipt of a control signal; and
        a third transistor coupled between a reference voltage and the output node.

2. The output driver of claim 1, wherein the first transistor comprises an n-channel metal-oxide-semiconductor (NMOS), the second transistor comprises a p-channel metal-oxide-semiconductor (PMOS), and the first supply voltage is less than the second, different supply voltage.

3. The output driver of claim 1, wherein the output node comprises an input/output (DQ) pad.

4. The output driver of claim 1, wherein the pre-driver comprises:
    a buffer configured to receive a first data signal and a second control signal and convey a first driver signal to a gate of the second transistor;
    a first inverter configured to receive a second data signal and a third control signal and convey a second driver signal to a gate of the first transistor; and
    a second inverter configured to receive a third data signal and a fourth control signal and convey a third driver signal to a gate of the third transistor.

5. The output driver of claim 4, further comprising a control unit configured to generate the first control signal based on at least one of the second control signal, the third control signal, and the fourth control signal.

6. The output driver of claim 5, wherein the control unit is further configured to receive a supply voltage substantially equal to the second, different supply voltage.

7. The output driver of claim 1, wherein the at least one switch comprises:
    a first switch for coupling the first transistor to the output node; and
    a second switch for coupling the second transistor to the output node.

8. The output driver of claim 7, wherein a size of the first switch is less than a size of the first transistor and a size of the second switch is less than a size of the second transistor.

9. The output driver of claim 1, wherein the first supply voltage is less than the second, different supply voltage.

10. A method of operating an output driver, comprising:
    coupling an output node to a first transistor coupled to a first supply voltage in response to at least one control signal;
    coupling the output node to the first supply voltage via the first transistor in response to the at least one control signal;
    coupling the output node to a second transistor coupled to a second supply voltage in response to at least one other control signal; and
    coupling the output node to the second supply voltage via the second transistor in response to the at least one other control signal.

11. The method of claim 10, wherein coupling the output node to the first transistor comprises coupling the output node to a p-channel metal-oxide-semiconductor (PMOS) transistor coupled to the first supply voltage having a first voltage level.

12. The method of claim 11, wherein coupling the output node to the second transistor comprises coupling the output node to an n-channel metal-oxide-semiconductor (NMOS) transistor coupled to the second supply voltage having a second voltage level less than the first voltage level.

13. The method of claim 10, wherein coupling the output node to the first transistor comprises coupling the output node to the first transistor via a switch, wherein a size of the switch is less than a size of the first transistor.

14. The method of claim 10, wherein coupling the output node to the second transistor comprises coupling the output node to the second transistor via a switch, wherein a size of the switch is less than a size of the second transistor.

15. The method of claim 10, wherein coupling the output node to the first transistor comprises coupling the output node to the first transistor via a first switch, wherein coupling the output node to the second transistor comprises coupling the output node to the second transistor via a second switch.

16. An electronic system comprising:
at least one input device;
at least one output device;
at least one processor device operably coupled to the input device and the output device; and
at least one memory device operably coupled to the at least one processor device and comprising interface circuitry including at least one output driver, the at least one output driver comprising:
an output node;
a first transistor coupled to a first supply voltage;
a second transistor coupled to a second supply voltage; and
a switching unit configured to couple the output node to one of the first transistor and the second transistor in response to receipt of a control signal.

17. The electronic system of claim 16, wherein the first transistor comprises an n-channel metal-oxide-semiconductor (NMOS) transistor and the second transistor comprises a p-channel metal-oxide-semiconductor (PMOS) transistor.

18. The electronic system of claim 17, wherein the first supply voltage is less than the second supply voltage.

19. The electronic system of claim 17, wherein:
a first terminal of the first transistor is configured to couple to the first supply voltage, a second terminal of the first transistor is coupled to the switching unit, and a gate of the first transistor is configured to receive a first signal from a pre-driver; and
a first terminal of the second transistor is configured to couple to the second supply voltage, a second terminal of the second transistor is coupled to the switching unit, and a gate of the second transistor is configured to receive a second signal from the pre-driver.

20. The electronic system of claim 16, wherein a size of each of first transistor and the second transistor is greater than a size of a switch of the switching unit.

* * * * *

UNITED STATES PATENT AND TRADEMARK OFFICE
CERTIFICATE OF CORRECTION

PATENT NO. : 10,902,907 B1  
APPLICATION NO. : 16/590668  
DATED : January 26, 2021  
INVENTOR(S) : Hyunui Lee Page 1 of 1

It is certified that error appears in the above-identified patent and that said Letters Patent is hereby corrected as shown below:

In the Specification

| | | |
|---|---|---|
| Column 4, | Line 28, | change "amain" to --a main-- |
| Column 6, | Line 21, | change "switch S" to --switch S1-- |
| Column 8, | Line 11, | change "switch S" to --switch S1-- |
| Column 11, | Line 39, | change "term "and/of" is" to --term "and/or" is-- |

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*